United States Patent
Froehlich et al.

(10) Patent No.: US 8,599,566 B2
(45) Date of Patent: Dec. 3, 2013

(54) PRINTED CIRCUIT BOARD

(75) Inventors: Thomas Froehlich, Reutlingen (DE);
Jochen Mehl, Holzgerlingen (DE);
Christian Johann, Reutlingen (DE);
Matthias Roder, Reutlingen (DE);
Franco Marcori, Moggio Udinese (IT);
Alain Bosero, San Deniele Del Friuli (IT)

(73) Assignee: Automotive Lighting Reutlingen GmbH (DE)

( * ) Notice: Subject to any disclaimer, the term of this patent is extended or adjusted under 35 U.S.C. 154(b) by 343 days.

(21) Appl. No.: 12/761,925

(22) Filed: Apr. 16, 2010

(65) Prior Publication Data
US 2010/0270923 A1 Oct. 28, 2010

(51) Int. Cl.
*H05K 5/00* (2006.01)
*H05B 33/08* (2006.01)

(52) U.S. Cl.
CPC .................... *H05B 33/0803* (2013.01)
USPC .......................... 361/752; 174/250

(58) Field of Classification Search
CPC .................................... H05B 33/0803
USPC .......... 174/250–256; 361/600, 720, 817, 752; 257/702, 701
See application file for complete search history.

(56) References Cited

U.S. PATENT DOCUMENTS

| | | | |
|---|---|---|---|
| 7,615,860 B2 * | 11/2009 | Su et al. .................. | 257/702 |
| 2005/0190531 A1 * | 9/2005 | Gall et al. ................ | 361/600 |
| 2008/0257587 A1 * | 10/2008 | Su et al. .................. | 174/254 |
| 2011/0149522 A1 * | 6/2011 | Johann et al. ........... | 361/720 |

FOREIGN PATENT DOCUMENTS

DE 102007040729 * 3/2009

* cited by examiner

*Primary Examiner* — Yuriy Semenenko
(74) *Attorney, Agent, or Firm* — Donald R. Boys; Central Coast Patent Agency, Inc.

(57) ABSTRACT

The invention relates to a printed circuit board having an insulating support layer and a layer of conductive material applied thereto. In order to increase the flexibility of the printed circuit board, it is proposed that material from the support layer have been removed at at least one point on the printed circuit board on a side of the support layer which is opposite the layer of conductive material in order to form a straight groove which extends from one side of the printed circuit board to another side of the printed circuit board, so that the printed circuit board can be bent along the groove, wherein the material of the support layer which has remained in the region of the groove and/or the layer of conductive material in the region of the groove form(s) a bending edge.

12 Claims, 11 Drawing Sheets

PRINTED CIRCUIT BOARD

CROSS-REFERENCE TO RELATED APPLICATIONS

The present application claims priority to German patent application serial number 10 2009 018 447.3, which was filed on Apr. 22, 2009, which is incorporated herein in its entirety, at least by reference.

BACKGROUND OF THE INVENTION

1. Field of the Invention

The present invention relates to a printed circuit board having an insulating support layer and a layer of conductive material applied thereto.

2. Description of Related Art

Printed circuit boards of the type cited at the outset are known from the prior art as "rigid printed circuit boards". They are used for mechanically mounting electronic components (resistors, capacitors, coils, integrated circuits (ICs), etc.) and for making electrical contact with said components. To this end, connecting lines (conductor tracks) are produced from the thin layer of conductive material by means of mask etching, for example. The components are usually soldered onto solder areas ("pads") or into holes and solder eyes (surrounding the holes) and in this way are mechanically mounted and have electrical contact made with them at the same time. However, other methods for mounting and/or making contact with the components on the printed circuit board are known, such as bonding, clamping or welding.

Conventional rigid printed circuit boards usually comprise an electrically insulating support material (base material) to which a copper layer has been applied. The layer thickness is typically 35 μm, and for applications with relatively high current levels it is between 70 μm and 140 μm. Previously, the base material used was frequently Pertinax (phenolic resin with paper fibers, "hard paper", material identifier FR2). Today, fiberglass mats soaked in epoxy resin are usually used (material identifier FR4). This material has better resistance to leakage currents and better radiofrequency properties and also lower water absorption than hard paper. For special applications, other materials are also used, such as Teflon or ceramic in LTCC or HTCC for radiofrequency technology or glass. For printed circuit boards with high demands on heat dissipation, base materials with metal cores are used, e.g. in the field of lighting technology for high-power LEDs.

A drawback of the known rigid printed circuit boards is the low flexibility thereof in terms of their shape. For this reason, known controllers are usually in the form of rectangular boxes, the bases of which have the rigid printed circuit board running on them. Shapes other than a rectangular shape for the controllers would make no sense, since the shape of said controllers would not be able to be filled efficiently by the known rigid printed circuit boards.

In addition, the prior art discloses flexible printed circuit boards, in which the insulating support layer comprises a film, for example of polyester, polyethylene naphthalate (PEN) or polyimide (PI). Flexible printed circuit boards have the advantage that their shape can also adapt to more complex shapes of controller housings, i.e. the interior of controllers can be used particularly efficiently. However, the flexible printed circuit boards have the drawback that their contours need to be punched. This is relatively complex and is suitable only for relatively large numbers of items on account of the relatively high tool and machine costs. Furthermore, the flexible printed circuit boards need to be held and/or fixed in their shape that is put into the controller, since they otherwise readopt their original shape on account of the flexibility of the support layer. In addition, the flexible printed circuit boards are not as robust as rigid printed circuit boards and can tear, for example. Finally, the flexible printed circuit boards are also relatively expensive.

In addition, the prior art discloses "rigid-flexible" printed circuit boards, which are a combination of flexible and rigid printed circuit boards. The connections comprise flexible runs which are nondetachably connected to the rigid portions of the printed circuit board. The rigid regions serve as a solid base for holding electrical components and connectors. The flexible connections can be used to determine and vary the position of the rigid portions supporting components. Rigid-flexible printed circuit boards are very complex to produce and therefore also very expensive, however.

BRIEF SUMMARY OF THE INVENTION

In summary, it can thus be stated that there is no optimum printed circuit board in existence to date. The present invention is therefore based on the object of designing and developing the rigid printed circuit board of the type cited at the outset such that it has a certain degree of flexibility in terms of its shape.

This object is achieved by proposing, on the basis of the printed circuit board of the type cited at the outset, that material from the support layer have been removed at at least one point on the printed circuit board on a side of the support layer which is opposite the layer of conductive material in order to form a straight groove which extends from one side of the printed circuit board to another side of the printed circuit board, so that the printed circuit board can be bent along the groove, wherein the material of the support layer which has remained in the region of the groove and/or the layer of conductive material in the region of the groove form(s) a bending edge.

The invention has recognized that the flexibility of the printed circuit board can be increased easily but very effectively by producing bending edges, at which the printed circuit board can be bent, in the printed circuit board through the targeted removal of material from the insulating support layer. Sufficient robustness in the region of the bending edges is ensured by virtue of the material of the conductive layer which remains in said region. The conductive material is usually so flexible that it allows the printed circuit board to be bent at the bending edges by up to 90°. However, bending angles merely in the region of a few degrees and preferably up to 45°, are sufficient to increase the flexibility of the printed circuit boards. In addition, the conductive material is of such robust and resistant design that it even allows the printed circuit board to be bent back and forth repeatedly without tearing or without other damage to the conductor tracks.

Preferably, all of the support material is removed as far as the conductive layer in the region of the grooves. Alternatively, it is conceivable for a thin layer of the support material to remain in a groove beneath the conductive layer. This allows the robustness along the bending edge to be increased. This can be attained particularly with low-brittleness, rather tougher or even flexible support materials. When using printed circuit boards having a plurality of conductor layers, what are known as multilayer printed circuit boards, the electrical transition from one printed circuit board segment to the other should occur only on one layer, namely on the layer of conductive material, which remains as a hinge between the two segments. The signals to be transmitted between the segments need to be combined on this layer for this purpose.

Alternatively, it would also be conceivable for the transition between the printed circuit board segments to be of multilayer design, with the layers in the region of the hinge between the segments being intended to be as close together as possible in order to allow the segments to move relative to one another. In this case, an insulating material can be introduced between the conductors on the individual layers.

It is furthermore conceivable for the robustness of the printed circuit board to be increased in the region of the grooves or bending edges by producing additional conductor tracks (what are known as stabilization tracks) on the printed circuit board which are not required for the purposes of circuitry but rather merely serve to provide additional mechanical robustness for the printed circuit board. These stabilization tracks can be produced in a joint work step together with the conductor tracks, which means that no additional steps are necessary. The removal of the material of the support layer in the region of the grooves is a simple matter. It is particularly advantageous to mill the grooves, for example. In addition, to reinforce the conductor tracks in the region of the hinge between the segments, it is also possible to use wire bridges which require only slight additional complexity in fitting components to the printed circuit board automatically.

In line with one advantageous development of the invention, it is proposed that the support layer contains a plurality of grooves, at least two of the grooves running parallel to one another. This allows the shape of the printed circuit board to be varied away from the originally purely two-dimensional shape toward a three-dimensional shape. Such a printed circuit board can fill controller housings with a shape which differs from the rectangular shape, for example with a curved housing wall, particularly well, since the shape of the printed circuit board can be matched to the curvature of the housing wall.

For a printed circuit board of more complex design, one preferred embodiment proposes that the support layer contains a plurality of grooves, at least two of the grooves running obliquely with respect to one another. This allows a particularly high level of flexibility to be achieved for the printed circuit board, since the latter can adopt almost any shape in three-dimensional space. It is possible for controller housings of almost any shape to be filled efficiently with the bent printed circuit board.

Advantageously, the insulating support material comprises ceramic, phenolic resin, epoxy resin, paper and/or fiberglass tissue. A combination of said materials is also conceivable, for example a resin with paper fibers or glass fibers. Any other suitable insulating material is naturally likewise conceivable. The layer of conductive material comprises copper, nickel, gold and/or tin. A combination or alloy of said materials is also conceivable. Any other suitable electrically conductive material is naturally likewise conceivable.

The particular advantages of the printed circuit board according to the invention take effect in particular when the printed circuit board is used in a motor vehicle controller. In motor vehicles, sometimes powerful tremors and vibrations and adverse operating conditions (temperatures in the motor vehicle from approximately −35° C. to approximately +150° C.) arise during a journey. For this reason, high demands are placed on the electrical components used, particularly on the printed circuit boards carrying the electrical components of circuits. These demands will be met by the rigid printed circuit board according to the invention, where the grooves milled into the support material simultaneously provide the flexibility of the printed circuit board. This is important because the increasing functions and equipment in modern motor vehicles mean that there is a chronic lack of space for components and units. The printed circuit board according to the invention can make optimum use of the available space. Controllers can be made smaller. Finally, the printed circuit board according to the invention is also simple, quick and inexpensive to produce, which is of great importance, particularly in the cost-sensitive automotive sector.

In line with another advantageous development, the printed circuit board (60) is designed for use in a controller for a motor vehicle lighting device. In line with a further preferred embodiment, the printed circuit board is designed for use in a controller or in a starter for a gas discharge lamp in a motor vehicle headlamp. Particularly when the printed circuit board is used in a large-scale integrated combined starter/controller for a gas discharge lamp, the printed circuit board according to the invention is of great advantage. Alternatively, the printed circuit board is designed for use in a controller for semiconductor light sources (LEDs) in a motor vehicle lighting device.

DETAILED DESCRIPTION OF THE INVENTION

Figure 2:
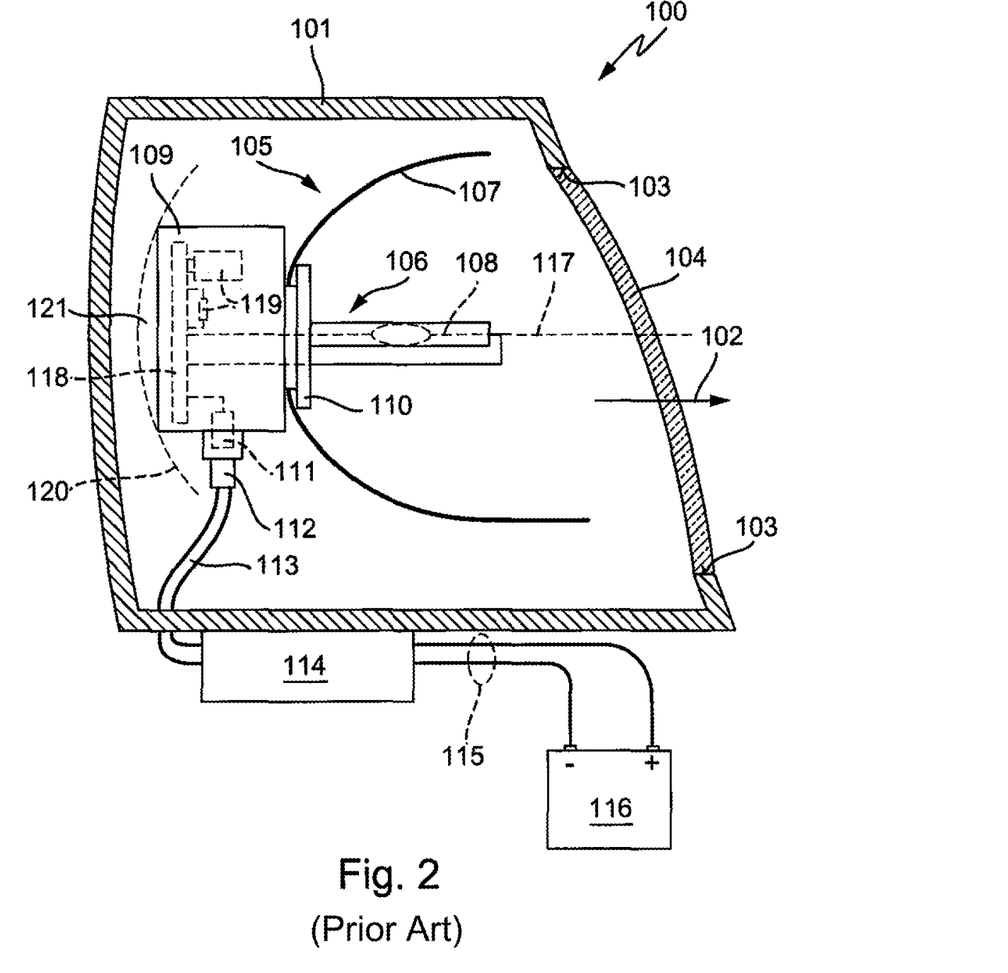
FIG. 2 shows a lighting device which is known from the prior art.

In FIG. 2, a lighting device which is known from the prior art in the form of a motor vehicle headlamp is denoted as a whole by the reference symbol 100. The lighting device 100 comprises a housing 101 which is preferably made from plastic. In the light exit direction 102, the housing 101 has a light exit opening 103 which is sealed by a transparent cover plate 104. The cover plate 104 is preferably in the form of a clear plate. However, it is also conceivable for the cover plate 104 to have optically active profiles (not shown), for example in the form of lenses, prisms or the like, particularly for scattering the light which passes through.

The interior of the housing 101 contains a light module 105 which has a light source 106 and a reflector 107. The light module 105 may be mounted in the headlamp housing 101 in one or more supporting frames so as to be pivotable in a horizontal and/or vertical direction. In this exemplary embodiment illustrated, the light source 106 is in the form of a gas discharge lamp with a glass tube 108, which is filled with an inert gas (for example xenon) and in which an arc is produced, and also with an integrated starter 109 which produces the high voltage necessary for igniting the arc in the glass tube 108, said voltage being in the region of approximately 25000 V, for example. The starter 109 may be mounted the lamp base either nondetachably (e.g. D1 or D3 lamp) or detachably (e.g. D2 or D4 lamp). The starter 109 and the glass tube 108 have a plate-like lamp base 110 formed between them which is used to mount the light source 106 on the reflector 107. The mounting of the lamp base 110 on the reflector 107 is shown in simplified form in FIG. 2. It is usually done using an essentially hollow-cylindrical reflector collar which is formed on the back of the reflector 107 and into which the base 110 is introduced. The inner circumferential side of the reflector collar usually has mounting means formed on it for mounting the light source 106 in a prescribed position relative to a reflective area of the reflector 107, but these are not discussed in more detail at this juncture.

The light module 105 shown in FIG. 2 is referred to as a reflection module, since the desired light distribution is produced solely by the light which is emitted by the light source 106 and which is reflected by the reflector 107, possibly under the influence of optically active profiles on the cover plate 104. In this case, the reflector 107 is preferably in the form of a free-form reflector which can produce the desired light distribution with and without a light-dark boundary without additional cover diaphragms and optically active profiles on the cover plate 104.

Apart from the components—light source 106 and reflector 107—shown in FIG. 2, the light module 105 may also have a projection lens (not shown) which projects the light beams emitted by the light source 106 and reflected and focused by the reflector 107 onto the road ahead of the motor vehicle in order to produce a desired light distribution. If the desired light distribution is meant to have a horizontal light-dark boundary, the reflector 107 and the projection lens may have a diaphragm arrangement provided between them with an approximately horizontal top edge, for example at the level of the optical axis 117 of the reflector 107 or directly beneath it. Such light modules are referred to as projection modules.

The underside of the starter 109 has an electrical plug-type element 111 provided on it in the form of a plug. The plug-type element 111 connects to a corresponding plug-type element 112 in the form of a socket. The plug-type elements 111 and 112 are used to produce electrical contact between the electrical components of the starter 109 and a shielded cable 113 which is routed to a controller 114 arranged outside of the headlamp housing 101. The controller 114 is for its part connected to a power source 116 in the motor vehicle onboard power supply by cable 115. The controller 114 controls the starter 109 and forms an input voltage for the starter 109 from the onboard power supply voltage (e.g. 6V, 12V, 24V), said input voltage being approximately in the region of 1000 V, for example. From this voltage, the starter 109 produces the high voltage necessary for igniting the arc in the glass tube 108 (e.g. 25000 V). Furthermore, the controller 114 provides the operating voltage, likewise formed from the onboard power supply voltage, for steady-state operation of the light source 106. In the normal steady-state operation of the light source 106, i.e. after the arc has been successfully ignited, the starter 109 is simply on.

The lighting device 100 with the external controller 114 is inserted into an installation space provided therefor in the motor vehicle and is mounted on the motor vehicle bodywork at that point. A drawback in the case of the known lighting devices 100 is that the installation space has to hold not only the headlamp housing 101 but also the controller 114 mounted thereon and needs to be of correspondingly large design. Furthermore, fitting the known lighting devices 100 is a complex matter, since the controller 114 needs to be arranged on the outside of the headlamp housing 101 and mounted thereon. In addition, the shielded cable 113 needs to be passed through an opening in the housing 101 and connected to the starter 109 using the plug elements 111 and 112. Finally, the cable 113, which is shielded to improve EMC compliance, is relatively expensive.

The interior (shown in dashes) of the starter 109 has a conventional rigid printed circuit board 118 to which conductor tracks have been applied in a conventional manner and to which electrical components, such as the electrical components 119 (coils, capacitors, resistors, etc.) shown by way of example, have been applied and contact-connected. In addition, the printed circuit board 118 is fitted with a plug element 111 in the form of a conventional plug connection system. The printed circuit board 118 usually comprises a rigid electrically insulating substrate to which the conductor tracks and the points of contact for the electrical components 119, 111 are applied by mask etching. The starters 109 for the known lighting devices 100 preferably involve the use of single-sided printed circuit boards or stamped grating structures (stamped conductors, embedded in an insulating material, e.g. plastic), in which conductor tracks are applied and components 119, 111 are arranged only on one side of the surface. The known starters 109 do not make optimum use of the installation space available inside the starter.

During operation of the lighting device 100, the greatest heat comes from the light source 106 or from the arc formed in the glass tube 108. The radiated heat results in severe heating of the reflector 107, which either comprises metal, for example aluminum die cast, or comprises a heat-resistant plastic with a reflective coating, for example a metal coat. To improve the EMC properties of the starter 109, it has a shield comprising metal, preferably comprising aluminum sheet, which is in electrically conductive and hence also in thermally conductive contact with the back of the reflector. This contact connection disadvantageously transmits a large portion of the heat from the reflector 107 to the shield of the starter 109 and hence indirectly to the printed circuit board 118 arranged therein and the electrical components 119, 111. This can result in very high thermal loads for the printed circuit board 118 and for the electrical components 119, 111 inside the starter 109. As a result, this either causes early ageing, malfunction and ultimately a fault in the printed circuit board 118 and the components 119, 111 or else it is necessary to use particularly heat-resistant printed circuit boards and electrical components, which are relatively expensive, however.

In the lighting devices 100 known from the prior art, the starter 109 usually has a rectangular shape. The outer walls of the starter 109 are all essentially planar, with adjacent walls being at right angles to one another, apart from relatively small curves in the region of edges and corners of the starter housing. Optimum use of the space available inside the headlamp housing 101 by the light module 105, particularly by the starter 109 for the light source 106 in the light module 105, is not the case here. In the prior art, it is more a case of the opposite. By way of example, the strictly angular shape of the starter 109 thus results in the area covered by the starter 109 (in FIG. 2 the path covered during vertical adjustment of the light module 105 is denoted by the reference symbol 120) being greater than actually necessary when the light module 105 pivots to regulate lighting range and/or to implement a cornering light function. On the back of the housing of the starter 109 there is an unused area 121 between the rear wall of the housing and the path of movement 120.

However, this means that the housing 101 of the lighting device 100 also inevitably has larger dimensions than actually necessary. A suitable design for the shape of the starter 109 can reduce the installation space required for the light module 105 inside the headlamp housing 101 and thereby make the design of the entire lighting device 100 smaller. A smaller installation space would then need to be provided in the motor vehicle, so that there would be more space available for the remaining units in the front area of the motor vehicle, particularly in the engine space. This is important particularly in view of the fact that motor vehicles have ever more functions, for which it is often necessary to arrange additional units or components in the engine space. Optimum use of the space available in the engine space is becoming more and more of a challenge.

Figure 1:
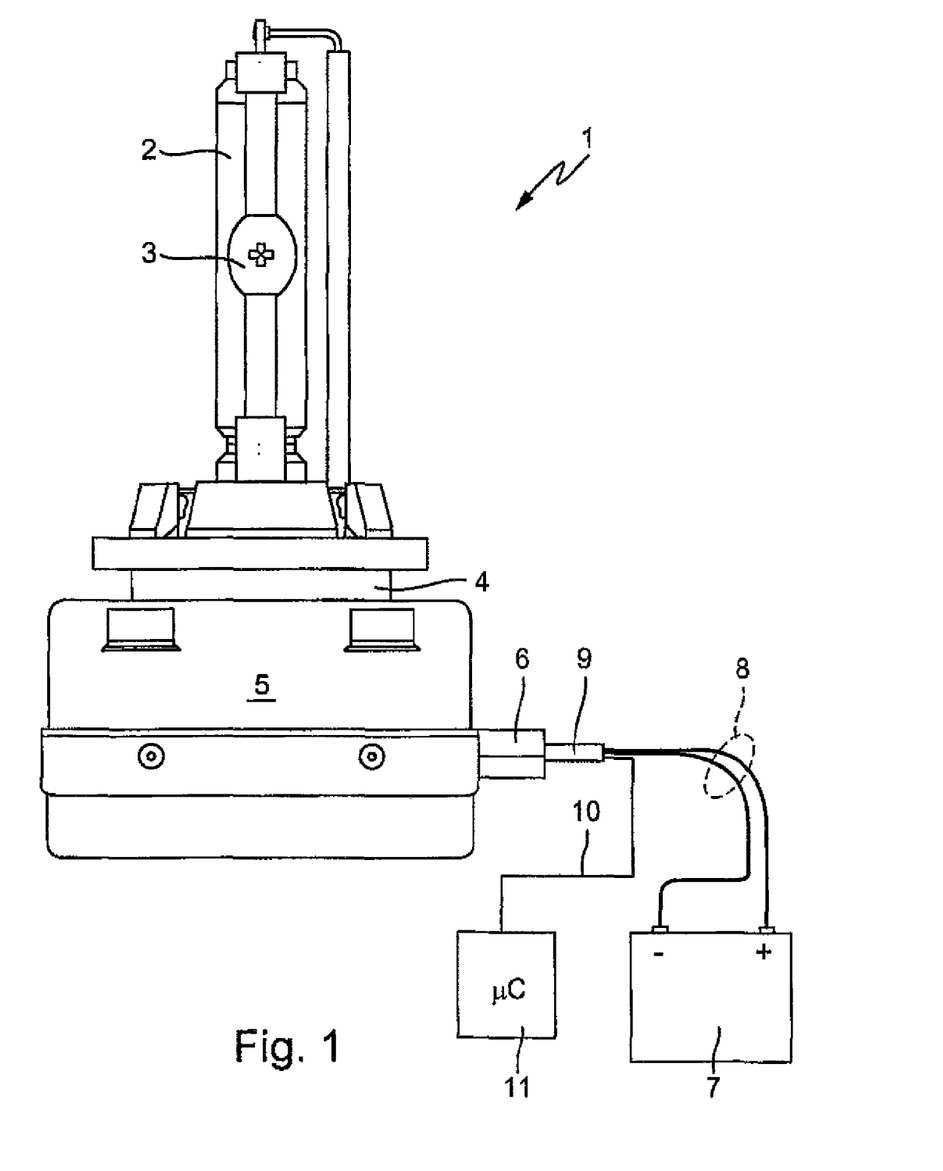
FIG. 1 shows a gas discharge lamp in a lighting device.

FIG. 1 shows a gas discharge lamp 1 in a lighting device, preferably a headlamp. In a similar manner to the gas discharge lamp 106 in the known lighting device 100, the gas discharge lamp 1 is mounted on a reflector and is arranged in the housing of the lighting device. The gas discharge lamp 1 comprises a glass tube 2 which is filled with inert gas and in whose interior 3 an arc for emitting light which is visible to the human eye is ignited and maintained. A lamp base 4 allows the gas discharge lamp 1 to be arranged on and mounted on the reflector collar of a reflector of the lighting device. In this case, the reflector surrounds the glass tube 2 in a similar manner to that shown in FIG. 2. That side of the lamp base 4 which is opposite the glass tube 2 has a combined starter/controller 5 arranged on it, which is an integral part of the light source 1, that is to say is nondetachably connected to the base 4.

In the gas discharge lamp 1, the controller functionality, which was performed by the external controller 114 in the prior art, has thus been integrated into the starter. Preferably, all electronic components are accommodated within a single housing of the combined starter/controller 5 in order to implement both the controller functionality and the starter functionality. This has the advantage that it is possible to dispense with the arrangement of a separate controller outside of the housing of the lighting device. It is therefore also no longer necessary to use a shielded cable for electrically connecting the controller to the starter. The lighting device described can be fitted more easily and more quickly than the previously known lighting devices. In addition, the lighting device described requires less space in the motor vehicle, which means that the installation space required for the lighting device in the motor vehicle can be given smaller proportions. There is thus more space available for other components and units in the front area of the motor vehicle.

The combined starter/controller 5 has a plug element 6 in the form of a plug. A power source 7 of the motor vehicle onboard power supply is connected to the combined starter/controller 5 by a cable 8 and a further plug element 9 in the form of a socket using the plug element 6. The plug elements 6, 9 can be used to connect not only power supply lines 8 but also actuation and/or signal lines 10 to the combined starter/controller 5. By way of example, an actuation line 10 can be used to transmit actuation signals from a superordinate motor vehicle controller 11 to the starter/controller 5 of the light source 1. Similarly, line 10 or another signal line can be used to transmit acknowledgements about the operation and mode of the gas discharge lamp 1 to the superordinate controller 11.

Various measures are conceivable for designing the integration of the controller functionality into the starter for the gas discharge lamp 1 in a particularly advantageous manner. By way of example, one aspect is particularly efficient use of the space available in the housing of the combined starter/controller 5 for the electrical components which are required in order to implement the starter and controller functionality. Furthermore, thermal aspects can be taken into account in order to prevent premature aging of the electrical components in the combined starter/controller 5 and/or to allow the use of cheaper, i.e. less heat-resistant components. Finally, special measures also allow particularly efficient use of the installation space available for the light module inside the housing of the lighting device so that the housing of the lighting device is no larger than previously, and can preferably even be designed to be smaller, despite the integration of the controller functionality into the starter.

Figure 3:
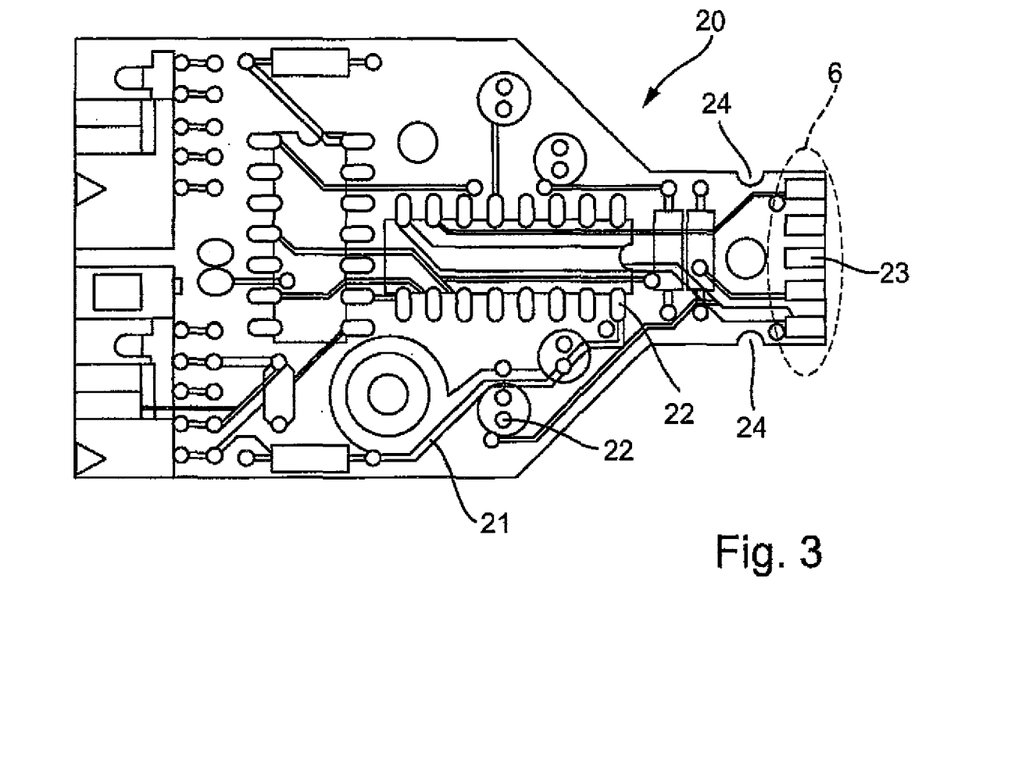
FIG. 3 shows a plan view of a printed circuit board in a combined starter/controller in a lighting device.

FIG. 3 shows an example of a printed circuit board 20 as used in the combined starter/controller 5 of a lighting device. The printed circuit board 20 has a multiplicity of conductor tracks 21 and points of contact 22 for electrical components. Examples of electrical components which may be provided are integrated circuits (IC1, IC2), resistors (R1, R2, R3, R4), capacitors (C5, C6, C7, C8) and coils. On the right-hand side of the printed circuit board 20 shown in FIG. 3, a plurality of pads 23 arranged next to one another are formed, some of the conductor tracks 21 being routed to some of the pads 23. The pads 23 form the electrical contacts of the plug element 6. In the case of the plug connector type described, the contacts 23 of the plug are thus to a certain extent produced via the conductor tracks of the printed circuit board 20. Implementing the plug element 6 therefore does not require the arrangement and contact-connection of additional electronic components taking up space on the printed circuit board 20. The plug element 6 is to a certain extent an integral part of the printed circuit board 20. The installation space required for the plug element 6 and the space for connecting the plug element 6 on the printed circuit board 20 can be significantly reduced by the implementation described with reference to FIG. 3.

The pads 23 can be applied to the printed circuit board 20 in the same way as the conductor tracks 21 and the points of contact 22. By way of example, a mask etching method is suitable for this. The mechanical connection to the plug connector element 9 (socket part) is ensured by appropriate milled recesses on the contour of the printed circuit board 20. By way of example, it is thus conceivable for detents on the socket part 9 plugged onto the plug part 6 to engage in cutouts 24 in the printed circuit board contour and to hold the socket part 9 detachably on the plug connector part 6 in this manner, so that the plug connection itself does not unintentionally come adrift in the event of vibrations during the operation of the motor vehicle.

Figure 4:
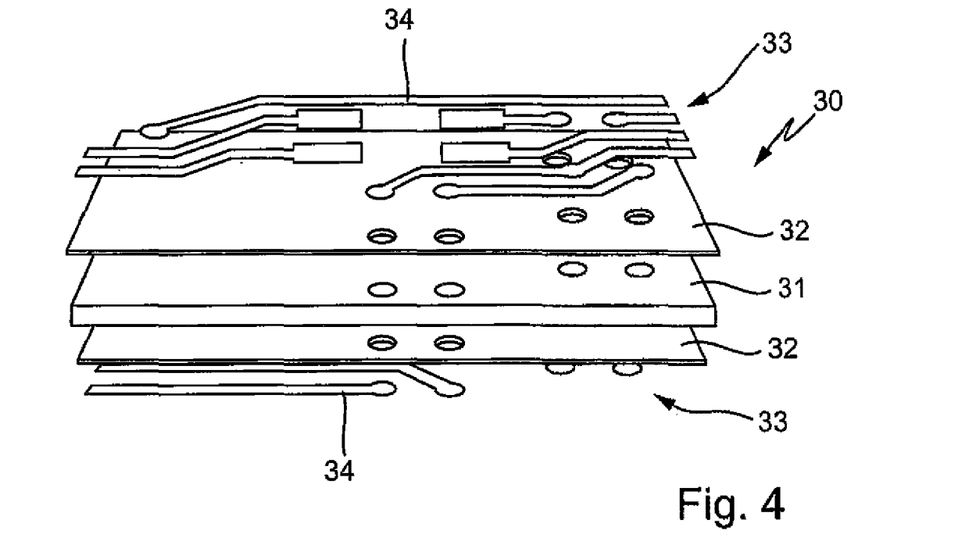
FIG. 4 shows an exploded illustration of a printed circuit board in a combined starter/controller in a lighting device.

A further measure for efficient use of the installation space available in the housing of the combined starter/controller 5 can be achieved, by way of example, by virtue of a multilayer printed circuit board being used instead of a single-layer printed circuit board on which conductor tracks are produced and electrical components are arranged only on one side. FIG.

4 shows an example of a two-layer printed circuit board 30 which has a support layer 31 comprising insulating material, for example a ceramic or silicon substrate. Additional thin insulating layers 32 may have been applied to both sides of the support layer 31. It goes without saying that it is conceivable, given appropriately suitable insulating properties of the support material 31, to integrate the function of the insulating layers 32 into the support material 31, that is to say to dispense with the separate insulating layers 32. Finally, both sides of the support layer 31 have a thin layer 33 of conductive material applied to them, with a portion of the conductive material being removed, for example by means of a mask etching method, in order to form the conductor tracks 34. Of the layer 33, only the conductor tracks and points of contact which are shown in FIG. 4 then remain. The use of a multilayer printed circuit board, such as the double-sided printed circuit board 30 shown in FIG. 4, has the advantage that in practice a multiple of conductor tracks and electrical components can be arranged on the same printed circuit board area. This means that it is possible to achieve significant savings in terms of the installation space required.

Figure 5:
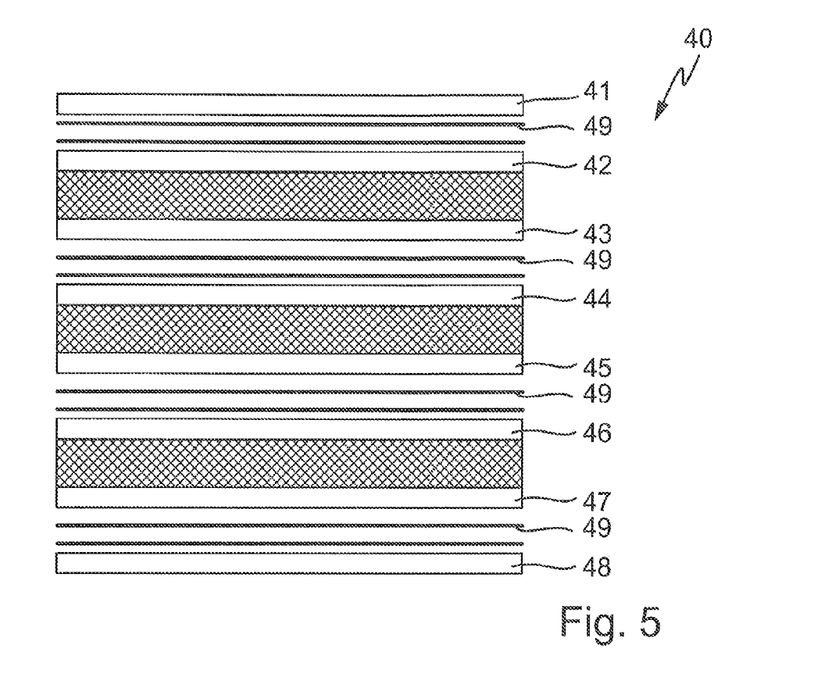
FIG. 5 shows a sectional view through a printed circuit board in a combined starter/controller in a lighting device.

FIG. 5 shows a multilayer printed circuit board 40 (known as a multilayer PCB) with a total of eight layers. The various layers of the printed circuit board 40 are denoted by the reference symbols 41 to 48. Between the various layers 41 to 48, it is possible for the conductor tracks 49 to be produced, the conductor tracks 49 on different layers naturally needing to be isolated from one another by suitable insulating layers (not shown in FIG. 5). Furthermore, the electronic components of the combined starter/controller 5, such as integrated circuits (ICs without a dedicated housing and only as a silicon chip), capacitors and resistors, can be integrated into the intermediate layers 42 to 47 of the printed circuit board 40. For a given printed circuit board area, this allows significantly more components to be accommodated than previously.

Figure 6:
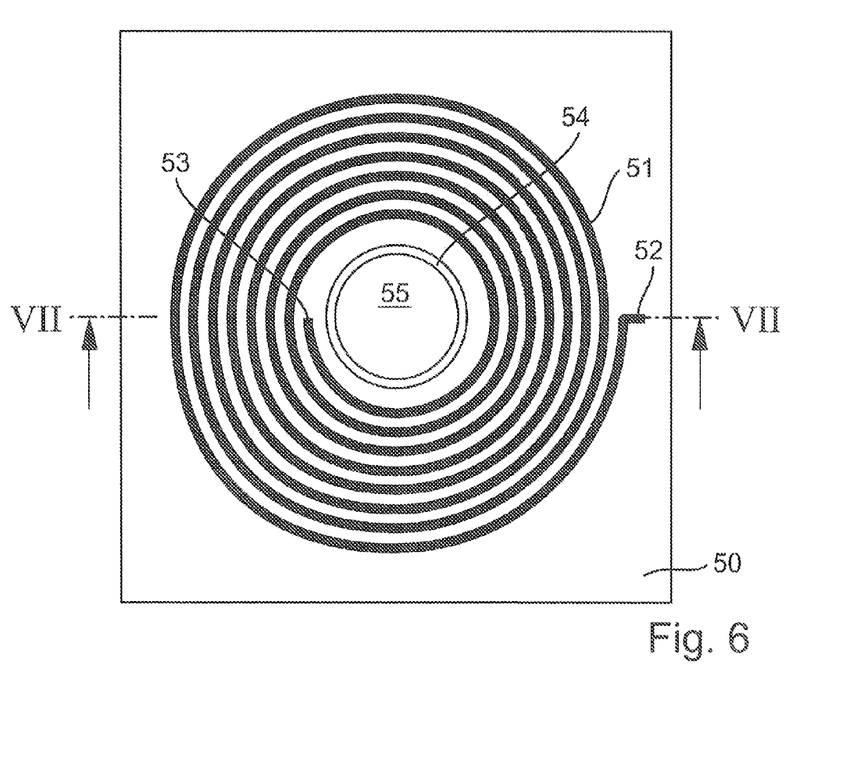
FIG. 6 shows a plan view of a portion of a printed circuit board in a combined starter/controller in a lighting device.

A further potential for reducing the installation space required for implementing the starter and controller functionality of the necessary assemblies arises by virtue of transformer and inductance windings which are required for the circuit being fitted so as to rest on the printed circuit board in spiral form or being in the form of conductor tracks on the printed circuit board. An appropriate exemplary embodiment of a transformer and inductance winding is shown in FIG. 6. The printed circuit board is denoted by the reference symbol 50. The transformer or inductance winding applied to the printed circuit board 50 as a conductor track in spiral form is denoted by the reference symbol 51. The winding 51 has two connections 52 and 53 at the start and end of the conductor track 51. The connection 53 is routed through the printed circuit board 50 onto the back of the printed circuit board 50, where a conductor track provided there then makes contact with it (cf. FIG. 7). Contact can be made with the connection 52 on that side of the printed circuit board 50 which is shown in FIG. 6.

Figure 7:
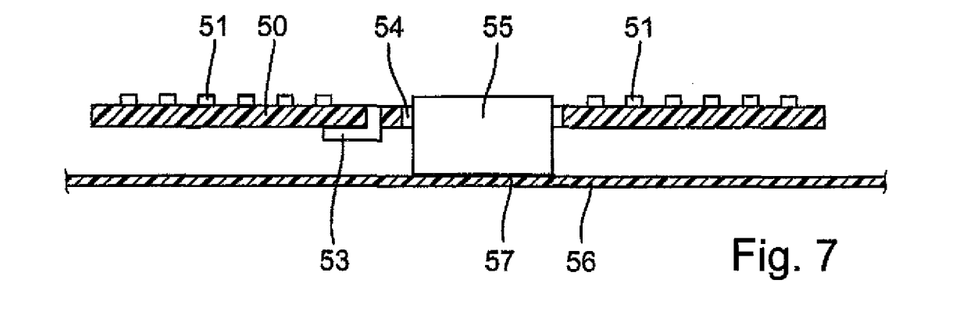
FIG. 7 shows a sectional view through the printed circuit board detail from FIG. 6 along the line VII-VII from FIG. 6.

FIG. 7 shows a cross section through the printed circuit board 50 along the line VII-VII in FIG. 6. In the center of the spiral winding 51, there is a cutout 54 in the printed circuit board 50 which contains a core 55. The core 55 is in contact with the housing 56 of the combined starter/controller 5. In this way, heat which arises in the core 55 during operation of the starter/controller 5 can be efficiently emitted to the metal housing 56, which acts as a kind of heat sink. Alternatively, the core may also be in the form of a planar type and produced by cutouts in the printed circuit board 50. In this embodiment too, the soft magnetic or ferromagnetic material forming the core may be in contact with the housing 56 to improve heat dissipation. Between the core 55 and the housing 56 of the combined starter/controller 5, means 57 may be formed to improve the heat transfer between core 55 and housing 56. Examples of such means 57 are a paste or coating with particularly good thermal conductivity. It is thus advantageous if the entire circuit of the combined starter/controller 5 is produced using microtechnology or thick-layer hybrid technology, with the high level of heat produced meaning that it is necessary to take measures for optimized temperature regulation in the housing 56 of the starter/controller 5.

Examples of measures for optimizing the temperature of the circuit of the starter/controller 5 other than those already cited are an arrangement of heat-sensitive electrical components in areas of the circuit which are subjected to lower levels of heat. Heat-sensitive components are deliberately put into cooler areas of the starter/controller 5. Components which emit a lot of heat are arranged a long way from the sensitive components in areas which afford good dissipation of the heat. Cooler areas may either be areas which contain components with low power loss or areas to which cooling air is supplied. The individual components of the circuit of the starter/controller 5 are thus positioned in the housing 56 on the basis of the temperature-sensitivity of the components and on the basis of the local operating temperature at the various positions in the housing 56. The local operating temperature in the housing 56 can be either ascertained by means of measurements in practice or simulated. Following appropriate positioning of the components, it is possible to ascertain the route of the conductor tracks in order to make proper contact with the positioned components, but where possible without altering the consciously chosen position of the components.

Furthermore, the electrical components of the circuit can be deliberately arranged in the housing 56 such that temperature gradients in the housing 56 are utilized to obtain an airstream which blows over and cools thermally critical components, in particular. Furthermore, the topology of the housing 56 of the starter/controller 5 can be designed such that the free cooling airstream is impaired or obstructed as little as possible. This can be achieved by means of topologies with low air resistance and little air turbulence, for example.

Figure 8:
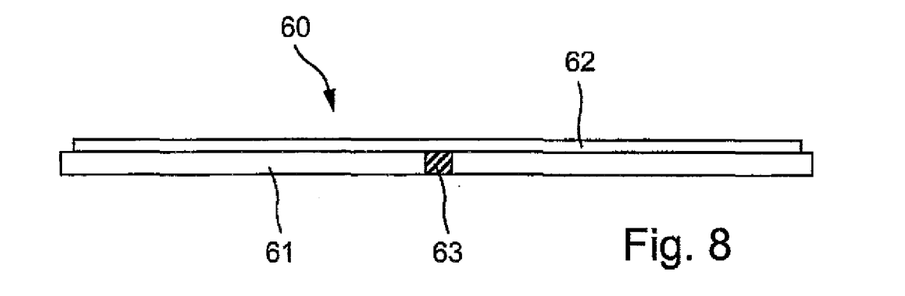
FIG. 8 shows an example of a printed circuit board according to the invention in a combined starter/controller in a lighting device according to the invention before a groove is milled into the printed circuit board.
Figure 9:
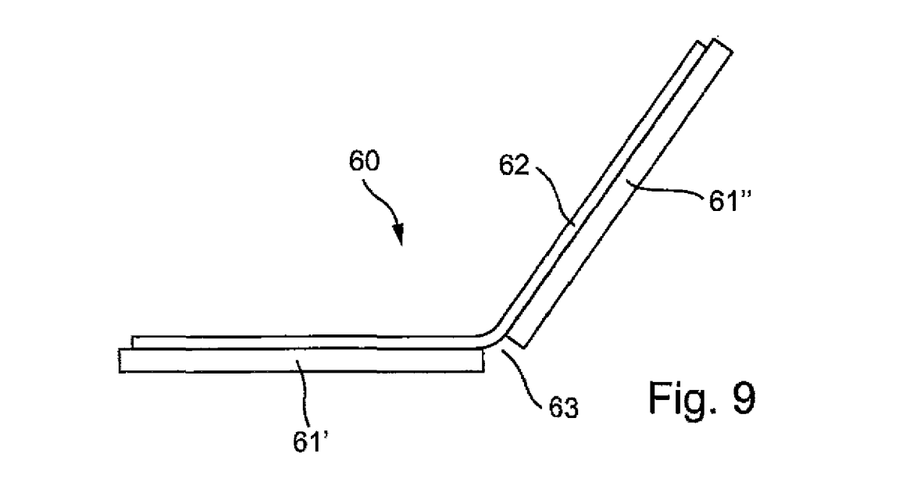
FIG. 9 shows the printed circuit board according to the invention from FIG. 8 after the groove has been milled

The use of the space available in the housing 56 of the combined starter/controller 5 can be optimized by using not one or more planar rigid printed circuit boards but rather one particular flexible printed circuit board according to the invention. FIG. 8 and FIG. 9 are used to describe an example of such a printed circuit board in more detail. The starting point is a conventional preferably rigid printed circuit board 60 which has a substrate 61 as support material. The support material 61 has a conductive layer 62 formed on it, from which it is possible to form the conductor tracks using a mask etching method, for example. A groove 63 is then made, for example milled, in the support material 61 of the printed circuit board 60. The material removed thereby from the substrate 61 is shown in hatched form in FIG. 8. When making the groove 63 in the support material 61, it is necessary to ensure that at least the conductive layer 62 remains—and also a portion of the support material 61 is necessary for reasons of robustness—in order to prevent the printed circuit board 60 from breaking up when fitted with components, installed in the housing 56 or during operation of the motor vehicle on account of tremors or vibrations.

Next, the printed circuit board 60 can be bent around along a bending edge formed by the groove 63, as shown by way of example in FIG. 9. In this case, the conductive layer 62 or the conductor tracks formed therefrom and possibly also the remaining portion of the support material 61 perform(s) the function of a hinge around which it is possible to bend the printed circuit board 60. In the exemplary embodiment shown, it can be seen that the formerly integral support material 61 of the printed circuit board 60 has now been split by the groove 63 into two pieces 61' and 61" which can be pivoted relative to one another around the groove 63.

Figure 11:
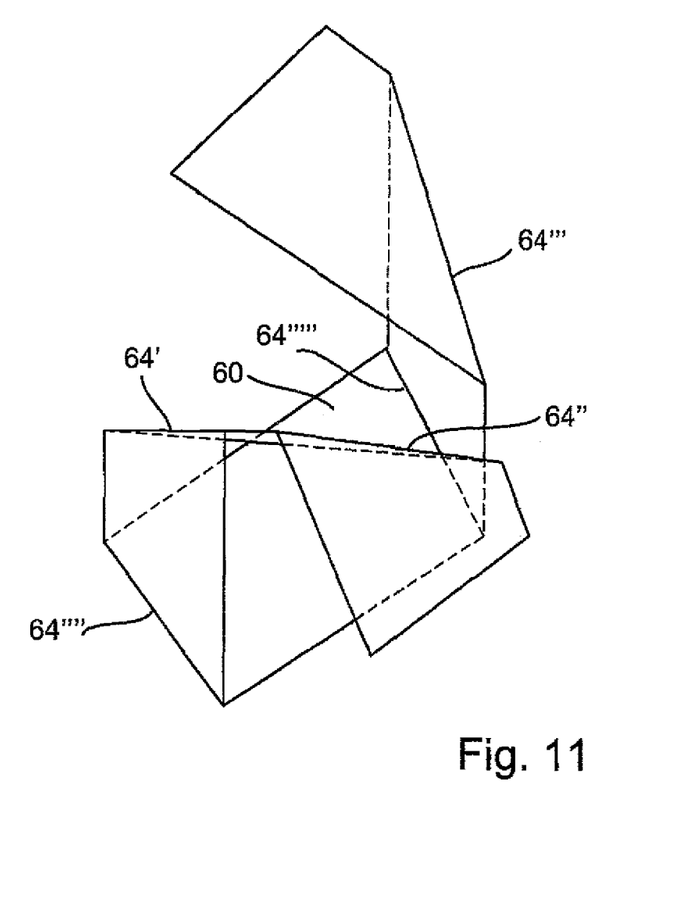
FIG. 11 shows a complex three-dimensional shape for a printed circuit board according to the invention.

It goes without saying that it is possible to make more than one groove 63 in a rigid printed circuit board, said grooves being able to run parallel or obliquely with respect to one another. In this way, the printed circuit board 60 is divided into a plurality of parts which can be pivoted relative to one another in a two-dimensional plane (in the case of parallel grooves) or even in three-dimensional space (grooves oblique or skew with respect to one another). In this way, it is possible to attain almost any three-dimensional structures with the printed circuit board 60. An example of a complex three-dimensional structure for the printed circuit board 60 is shown in FIG. 11. The various bending edges are denoted by reference symbol 64. This allows the printed circuit board 60 to be fitted into the interior of the housing 56 of the combined starter/controller 5 in optimal fashion. It is crucial to the robustness of the printed circuit board 60 that it is a rigid, that is to say particularly dimensionally stable, printed circuit board which can have its shape altered by particular measures (making a groove 63 in the substrate 61 of the printed circuit board 60) at particular points or along selected bending edges 64.

Figure 10:
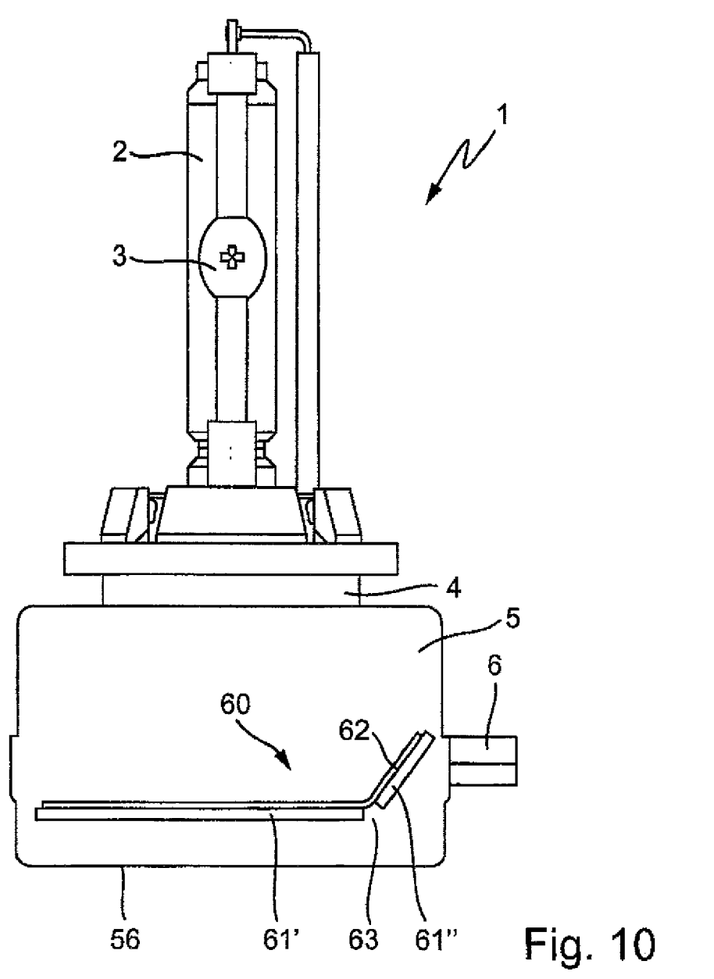
FIG. 10 shows a gas discharge lamp with a combined starter/controller with a printed circuit board according to the invention as shown in FIG. 9 arranged therein.

FIG. 10 shows a gas discharge lamp 1 based on the one shown in FIG. 1. In this case, the combined starter/controller 5 is shown in partial section, so that the supple printed circuit board 60 can be better recognized in the housing 56. It can immediately be seen that the inherently rigid but nevertheless supple—in the region of the grooves 63—printed circuit board 60 has found a good compromise in respect of the particularly high demand on robustness of the printed circuit board 60, on the one hand, and optimum utilization of the interior of the housing 56 of the starter/controller 5 in motor vehicles. This is particularly true for printed circuit boards 60 which can be bent repeatedly, particularly for printed circuit boards 60 which can be deformed in three-dimensional space.

The printed circuit board 60 according to the invention has been described in more detail using the example of a printed circuit board for a combined starter/controller 5 in a gas discharge lamp 1. It goes without saying that the supple printed circuit board 60 can also be used in any other motor vehicle controllers. This is particularly mindful of the use of the printed circuit board 60 according to the invention in a controller for semiconductor light sources (LEDs) in lighting devices.

Figure 12:
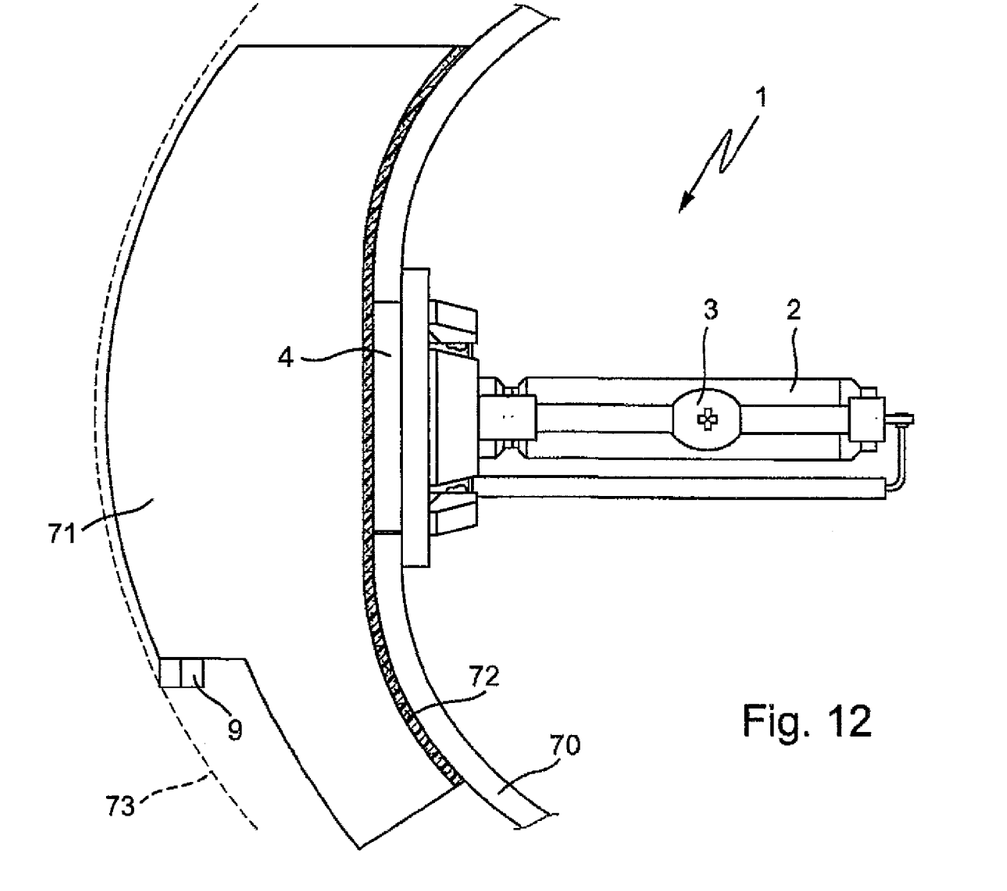
FIG. 12 shows a side view of a detail from a lighting device, comprising a gas discharge lamp with an integrated combined starter/controller and a portion of a reflector.

In the lighting devices 100 with a gas discharge lamp 106 which are known from the prior art, the starter 109 is arranged at a distance from the back of the reflector 107. Furthermore, it extends only over a subregion of the back of the reflector 107. This loses a lot of space inside the headlamp housing 101 which could be better used elsewhere. In this regard, the embodiment from FIG. 12 provides a good solution. This figure shows a detail from a lighting device in a side view. In particular, a portion of a reflector 70 is shown on which the gas discharge lamp 1 is mounted by means of its base 4. The housing 71 of the combined starter/controller 5 is designed in a particular manner. Firstly, that side of the housing 71 which points toward the reflector 70 is in the form such that as much of its full area as possible rests on the back of the reflector 70 when the gas discharge lamp 1 is mounted on the reflector 70. Particularly in the inner region around the optical axis, the reflector 70 is of almost rotationally symmetrical design, which means that it is possible for the full area of the housing 71 to rest on the back of the reflector 70, the rotational symmetry meaning that it is even possible to change the lamp 1 by rotating the lamp 1 around its lamp axis and removing the lamp backwards (counter to the light exit direction). In this way, optimum use is made of the space between the housing 71 of the starter/controller 5 and the reflector 70. To prevent excessive heating of the housing 71 by the reflector 70, which is directly exposed to the rays of heat emitted by the gas discharge lamp 1, the housing 71 and the back of the reflector 70 have a thermally insulating layer 72 between them comprising material which is a poor conductor of heat, e.g. ceramic or another filling material for capacitors, to provide thermal insulation for the starter/controller 5 from the relatively hot reflector 70. In this way, the space between the housing 71 of the starter/controller 5 and the reflector 70 can be used in optimum fashion without the functionality of the circuit being impaired on account of high temperatures.

For the purpose of EMC shielding of the electromagnetic radiation produced by the combined starter/controller 71 and the gas discharge lamp 1 with respect to the outside world, a capacitive coupling which is electrically conductive for radiofrequency signals may be provided between the starter/controller 71 and the reflector 70. This is therefore a high-impedance connection between the starter/controller 71 and the reflector 70. It may be achieved with a material with a high $\epsilon_r$ value (relative permittivity), for example. Such a material is air, for example, or the insulating material usually used for capacitors (e.g. PEN (polyethylene naphthalate) or ceramic). In this context, the front of the starter/controller 71 and the back of the reflector 70 are arranged at a short distance with a large coverage area, the insulating material being arranged between the two areas. The heat-insulating material for thermally decoupling the starter/controller 71 and the reflector 70 can simultaneously be used as electrical insulating material for capacitively coupling the starter/controller 71 and the reflector 70.

A further aspect of the housing 71 of the starter/controller for the gas discharge lamp 1 of the lighting device from FIG. 12 can be regarded as the rear wall of the housing 71, which is rounded off in the shape of cylindrical segment. When the light module is adjusted vertically, the rear wall of the housing 71 moves on a circular path 73. The rear wall is rounded off such that it runs exactly on or slightly inside the path 73. This means that a cylinder axis for the rear wall, which is rounded off in the shape of a cylindrical segment, is oriented approximately horizontally and runs through a point of rotation for the adjusting movement of the light module. In this way, the space behind the starter/controller of the gas discharge lamp 1, that is to say the space between the rear wall of the housing 71 and the rear wall of the headlamp housing (not shown), can be used particularly efficiently. The rear wall of the headlamp housing can be shaped in accordance with the rear wall of the housing 71 and can be brought particularly close to the rear wall of the housing 71. In this way, the installation space required for installing the lighting device in the motor vehicle can be made particularly small, which means that additional space for other units and components can be provided in the front region of the vehicle.

Figure 13:
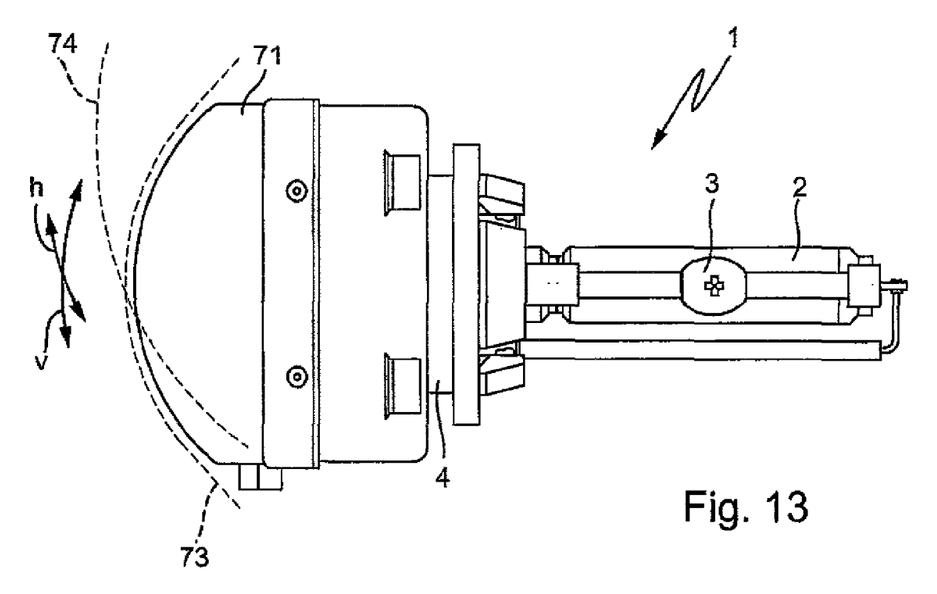
FIG. 13 shows a side view of a gas discharge lamp with an integrated combined starter/controller in a lighting device.

The embodiment shown in FIG. 12 has particular advantages for a lighting device with headlamp beam height control, i.e. where the light module can be adjusted in the vertical direction. If horizontal adjustment of the light module is additionally possible to implement a cornering light function, a rear wall of the housing 71 of the combined starter/controller, which rear wall is curved in a shape of a spherical segment, affords particular advantages, as shown by way of example in FIG. 13. The circular path on which the rear wall of the starter/controller 71 moves when the light module is adjusted vertically v is denoted by the reference symbol 73. A circular path on which the rear wall of the starter/controller 71 moves when the light module is adjusted horizontally h is denoted by the reference symbol 74. The rotary axes of the vertical adjustment v and of the horizontal adjustment h preferably intersect at a point of intersection which is simultaneously the center of rotation of the light module. A center of the spherical segment of the rear wall of the housing 71 of the starter/controller is preferably located exactly at the point of intersection of the two rotary axes. In this way, the space required for the starter/controller inside the headlamp housing becomes particularly small and the entire lighting device can be produced in particularly compact form. This means that the installation space required for installing the lighting device in the motor vehicle can be produced in particularly small form, so that additional space for other units and components can be provided in the front region of the vehicle.

A particularly highly formulated geometric embodiment of the shape of the housing 71 of the combined starter/controller thus allows particularly efficient use to be made of the space available inside the headlamp housing for the starter/controller. The curved housing shapes of the starter/controller in the exemplary embodiments shown in FIGS. 11 and 12 can be utilized particularly efficiently through the use of printed circuit boards based on exemplary embodiments in FIGS. 8 to 10. The printed circuit board can be matched to the shape of the rear wall of the housing 71.

Figure 14:
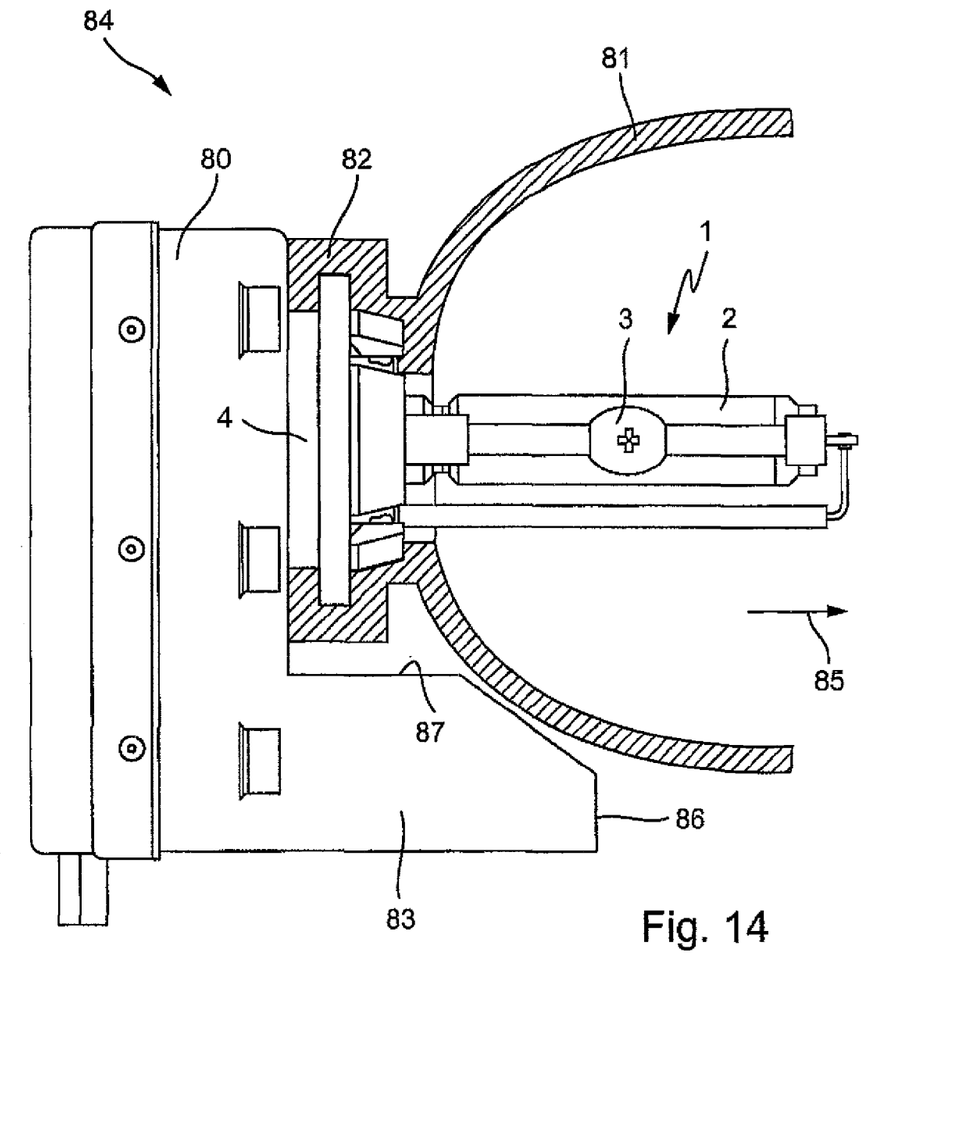
FIG. 14 shows a side view of a portion of a lighting device, comprising a gas discharge lamp with an integrated combined starter/controller, and a reflector.

A further example of particularly efficient use of the space available in the headlamp housing for the combined starter/controller 80 is shown in FIG. 14. As already explained, the gas discharge lamp 1 is mounted by its base 4 on the reflector 81 in a reflector collar 82, formed on the back of the reflector 81, in a defined position relative to the reflective area. In conventional lighting devices (cf. FIG. 2), this results in a relatively large amount of unused space between the front wall of the housing of the starter/controller 80 and the rear wall of the reflector 81. This space can be used by the embodiment shown in FIG. 14 by virtue of the housing of the starter/controller 80 being at least partially extended forward in the direction of the reflector 81 around the reflector collar 82 in the region of the front wall. In the exemplary embodiment shown, the front wall of the starter/controller 80 has been displaced beneath the reflector collar 82 in the direction of the reflector 81, so that the housing of the starter/controller 80 has an additional space 83 beneath the reflector collar 82 which can be used for arranging printed circuit boards and/or electrical components of the starter/controller 80. In this way, there is more space available for the electronics inside the housing of the starter/controller 80, without the dimensions of the light module 84 increasing. Only the installation space available in the light module 84 is used particularly efficiently.

Preferably, at least one wall, directed towards the back of the reflector 81, of the additionally provided space 83 of the starter/controller 80 at least approximately matches the shape of the rear wall. This applies particularly to the front wall 86, in the light exit direction 85, of the space 83 and to that wall of the space 83 which is directed toward the reflector collar 82, in the exemplary embodiment the top wall 87. In the exemplary embodiment shown, the connection between the front wall 86 and the top wall 87 is of oblique design, the angle of the oblique corresponding approximately to the profile of the rear wall of the reflector 81 at the appropriate region. It goes without saying that it is conceivable for the connecting wall between the front wall 86 and the top wall 87 to be designed not to be straight or planar but rather curved, so that it runs equidistantly from the rear wall of the reflector 81.

It goes without saying that these embodiments can be combined with one of the preceding embodiments, particularly with the curved rear wall of the housing of the starter/controller based on the embodiments shown in FIGS. 11 and 12.

FIG. 12 shows an exemplary embodiment in which the front wall of the combined starter/controller rest with its full area on the rear wall of the reflector. A critical point in this case is the transmission of heat from the reflector to the housing of the starter/controller and the associated high operating temperatures in the starter/controller. For this reason, in the exemplary embodiment from FIG. 12, the contact area between the front wall of the housing of the starter/controller and the rear wall of the reflector has a heat-insulating layer provided on it.

To improve the cooling of critical components of the light module, particularly of the housing of the starter/controller, temperature gradients can be utilized in targeted fashion to achieve a cooling airstream along the housing of the starter/controller. In this connection, the topology of components of the light module can be deliberately designed such that the cooling airstream is not obstructed. These are topologies with low air resistance and little air turbulence. Where possible, the airstream can even be conveyed by virtue of more air per unit time flowing and/or the speed of flow of the airstream being accelerated in a particular region.

Figure 15:
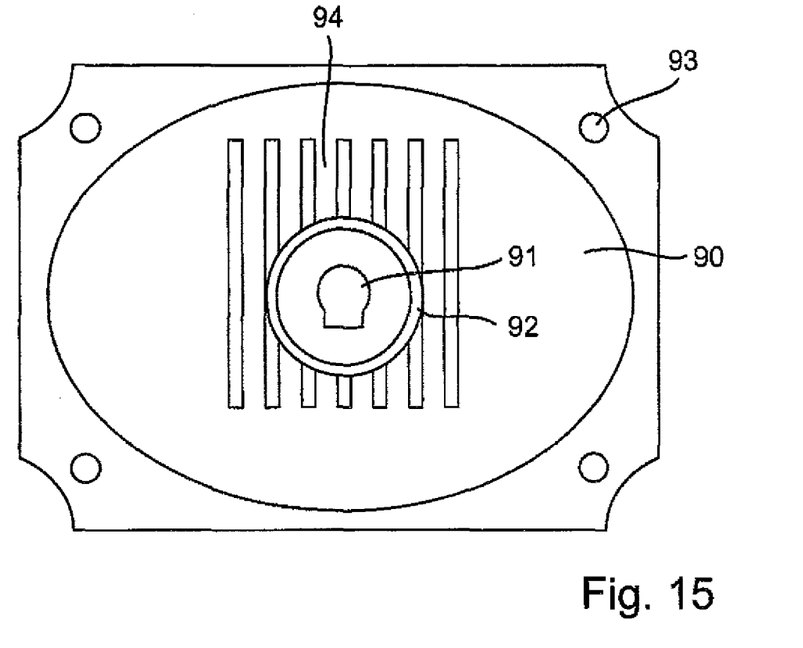
FIG. 15 shows a view of the back of a reflector in a lighting device in the light exit direction.

FIG. 15 shows a back of a reflector 90. The reflector 90 has a central opening 91 through which the glass tube of the gas discharge lamp is introduced into the inside of the reflector. The opening 91 is surrounded by a reflector collar 92 which projects backward from the back of the reflector 90. The reflector collar is used for holding and mounting the lamp base of the gas discharge lamp. Furthermore, the front edge of the reflector 90 has mounting elements in the form of openings 93 for mounting a support for a projection lens (not shown) of the light module, so that said projection lens is arranged after the reflector 90 when viewed in the light exit direction.

A subregion of the back of the reflector 90 has air-guiding means 94 which, by way of example, may be in the form of a plurality of ribs, which are arranged next to one another and project from the rear wall of the reflector 90, and/or depressions made in the rear wall. The region with the air-guiding means 94 corresponds to the region on which the front of the housing of the starter/controller rests when a gas discharge lamp is fitted (cf. FIG. 12). The air-guiding means 94 thus form air channels between the back of the reflector 90 and the front of the overlying starter/controller. Cooling air can flow via these channels and transports heat away from the reflector 90 or from the housing of the starter/controller.

Figure 16:
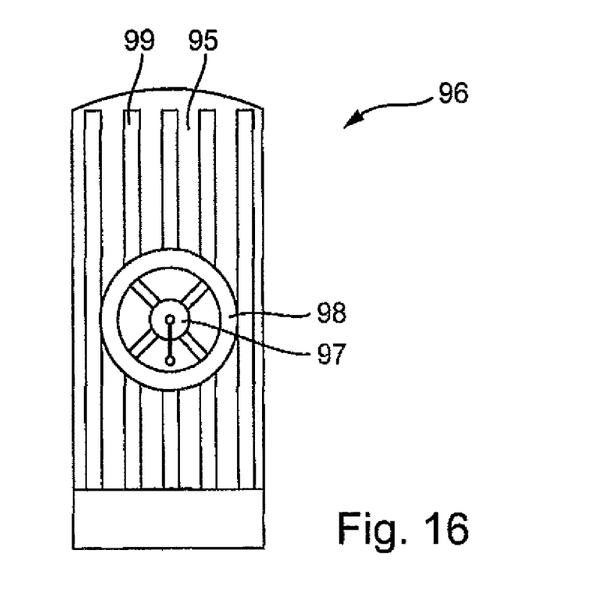
FIG. 16 shows a view of a gas discharge lamp with an integrated combined starter/controller counter to the light exit direction.

It goes without saying that the air-guiding means 94 do not necessarily need to be produced on the back of the reflector 90. FIG. 16 shows a gas discharge lamp 96 in a front view, i.e. counter to the light exit direction. The lamp 96 comprises a glass tube 97 filled with inert gas and a lamp base 98. The front of the combined starter/controller 95, which is visible in FIG. 16, is designed such that it rests with as much of its full area as possible on the back of the reflector, or extends at a short distance from the latter, when the lamp 96 is fitted to the reflector. Alternatively or in addition to the air-guiding means 94 on the back of the reflector 90, air-guiding means 99 are arranged on the front of the housing 95 of the starter/controller. Said air-guiding means are in the form of a plurality of ribs, for example, which are arranged next to one another and project from the front of the housing 95, and/or depressions made in the front.

It would also be conceivable, in addition or as an alternative to the air-guiding means 94 and 99, to provide air-guiding means in a heat-insulating layer (e.g. the layer 72 in FIG. 12) between the front of the housing 95 and the rear wall of the reflector 90. Said means may be in the form of a plurality of ribs, which are arranged next to one another and project from the front of the housing 95, and/or depressions made in the front, for example. In this embodiment, it would be conceivable for the front of the housing 95 and/or the rear wall of the reflector 90 to be of smooth design, i.e. without the air-guiding means 94, 99. In this case, the air-guiding means could be produced solely in the heat-insulating layer. A smooth design of the rear wall of the reflector 90 would have the advantage that standard reflectors could be used.

The shape of the air channels could also be chosen such that the cross section of the channels is reduced in the direction of flow. This increases the speed of flow and more heat can be transported away. It is readily possible to design the ribs and depression in corresponding fashion.

It goes without saying that any combination of the cited exemplary embodiments is possible. The aim in this context is always to achieve practical integration of the controller functionality into the starter of a gas discharge lamp. The problems of space and temperature, in particular, are considered in this case. These are interdependent upon one another, however, i.e. the temperature problems increase as the design of the starter/controller 5; 80 becomes increasingly compact.

The invention claimed is:

1. A printed circuit board arranged in a housing having an insulating support layer and a layer of conductive material applied thereto, wherein material from the support layer has been removed from a plurality of regions on the printed circuit board on a side of the support layer which is opposite the layer of conductive material in order to form straight grooves arranged parallel and obliquely from each other, at least some of the grooves extending from one edge of the side of the printed circuit board to another edge of the side of the printed circuit board, so that the printed circuit board can be bent along the grooves, wherein the material of the layer of conductive material in the region of the printed circuit board form(s) a bending edge at each of the plurality of regions forming a three dimensional structure fitting integrally on an interior curved surface of the housing.

2. The printed circuit board as claimed in claim 1, wherein the insulating support material is rigid.

3. The printed circuit board as claimed in claim 1, wherein the insulating support material comprises ceramic, phenolic resin, epoxy resin, paper or fiberglass tissue.

4. The printed circuit board as claimed in claim 1, wherein the layer of conductive material comprises copper, nickel, gold and/or tin, and the layers of conductive material forming the bending edge are reinforced.

5. The printed circuit board as claimed in claim 1, wherein the at least one groove is made in the support material by milling.

6. The printed circuit board as claimed in claim 1, wherein the printed circuit board is designed in a manner to be assembled as a motor vehicle controller installed in the housing.

7. The printed circuit board as claimed in claim 6, wherein the printed circuit board is designed in a manner to be assembled in the controller for a motor vehicle lighting device.

8. The printed circuit board as claimed in claim 7, wherein the printed circuit board is designed in a manner to be assembled in the controller and/or in a starter or in a combined starter/controller for a gas discharge lamp in a motor vehicle headlamp.

9. The printed circuit board as claimed in claim 7, wherein the printed circuit board is designed in a manner to be assembled in the controller for semiconductor light sources in a motor vehicle lighting device.

10. The printed circuit board as claimed in claim 7, wherein the lighting device is for the motor vehicle having a radiation source for emitting electromagnetic radiation, particularly in the form of light which is visible to the human eye, having a reflector for focusing the radiation emitted by the radiation source, and the controller is for controlling and/or regulating at least one function of the lighting device, wherein the controller includes the printed circuit board.

11. The printed circuit board as claimed in claim 10, wherein the radiation source is a gas discharge lamp having a combined starter/controller which is integrated in the lamp for the purpose of providing the starter and controller functionality, and the printed circuit board is arranged in a housing of the starter/controller.

12. The printed circuit board as claimed in claim 10, wherein the radiation source comprises at least one semiconductor light source and the printed circuit board is arranged in a housing of the controller for the at least one semiconductor light source.

* * * * *